(12) United States Patent
Wang et al.

(10) Patent No.: US 7,109,111 B2
(45) Date of Patent: Sep. 19, 2006

(54) METHOD OF ANNEALING METAL LAYERS

(75) Inventors: Zhonghui Alex Wang, Sunnyvale, CA (US); Bo Zheng, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 846 days.

(21) Appl. No.: 10/074,353

(22) Filed: Feb. 11, 2002

(65) Prior Publication Data

US 2003/0162392 A1 Aug. 28, 2003

(51) Int. Cl.
*H01L 21/44* (2006.01)

(52) U.S. Cl. ...................... 438/663; 438/660
(58) Field of Classification Search ................. 438/663
See application file for complete search history.

(56) References Cited

U.S. PATENT DOCUMENTS

| | | | |
|---|---|---|---|
| 5,111,023 A | 5/1992 | Horibe et al. | 219/121.85 |
| 5,180,482 A | 1/1993 | Abys et al. | 205/224 |
| 5,252,807 A | 10/1993 | Chizinsky | 219/390 |
| 5,933,757 A | 8/1999 | Yoshikawa et al. | 438/682 |
| 6,126,761 A * | 10/2000 | DeHaven et al. | 148/518 |
| 6,184,572 B1 | 2/2001 | Mountsier et al. | 257/637 |
| 6,221,765 B1 * | 4/2001 | Ueno | 438/653 |
| 6,228,768 B1 | 5/2001 | Woo et al. | 438/691 |
| 6,228,779 B1 | 5/2001 | Bloom et al. | 438/763 |
| 6,265,320 B1 | 7/2001 | Shi et al. | 438/725 |
| 6,294,442 B1 | 9/2001 | Kamal | 438/486 |
| 6,296,906 B1 | 10/2001 | Stimmell et al. | 427/377 |
| 6,297,154 B1 * | 10/2001 | Gross et al. | 438/663 |
| 6,319,387 B1 | 11/2001 | Krishnamoorthy et al. | 205/240 |
| 6,326,297 B1 | 12/2001 | Vijayengran | 438/627 |
| 6,825,124 B1 * | 11/2004 | Kim | 438/700 |
| 2002/0092584 A1 * | 7/2002 | Soininen et al. | 148/282 |
| 2003/0057614 A1 * | 3/2003 | Weaver et al. | 266/81 |

* cited by examiner

*Primary Examiner*—Thao P. Le
(74) *Attorney, Agent, or Firm*—Patterson & Sheridan LLP

(57) ABSTRACT

A method of annealing a metal layer on a substrate in a chamber is provided. The method comprises positioning a substrate with a metal layer thereon in a chamber, removing atmospheric gases from the chamber, providing process gas to the chamber, and annealing the metal layer at a temperature greater than about 80 degrees Celsius. Also provided is a method of forming a feature on a substrate. The method comprises depositing a dielectric layer on the substrate, forming at least one opening within the dielectric layer, depositing a metal layer in the opening, positioning the substrate in an annealing chamber, removing atmospheric gases from the annealing chamber, providing process gas to the annealing chamber, and annealing the metal layer at temperature greater than about 80 degrees Celsius.

63 Claims, 4 Drawing Sheets

METHOD OF ANNEALING METAL LAYERS

BACKGROUND OF THE INVENTION

1. Field of the Invention

Embodiments of the present invention generally relate to the processing of a metal layer on a substrate. More particularly, embodiments of the present invention relate to a method of annealing a copper layer on a substrate.

2. Background of the Related Art

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

As circuit densities increase, the widths of vias, contacts, lines, plugs, and other features, generally decrease to less than a quarter of a micron. The thickness of the dielectric layers, however, generally remains substantially constant, with the result that the aspect ratios for the features, i.e., their height divided by width, increases. Due to copper's electrical performance at such small feature sizes, copper has become a preferred metal for filling sub-quarter micron, high aspect ratio interconnect features on substrates. However, many traditional deposition processes, such as physical vapor deposition (PVD) and chemical vapor deposition (CVD), have difficulty filling structures with copper material where the aspect ratio exceed 4:1, and particularly where the aspect ratio exceeds 10:1. As a result of these process limitations, electrochemical plating (ECP), which had previously been limited to the fabrication of lines on circuit boards, is now being used to fill vias and contacts on semiconductor devices.

A typical copper electroplating deposition method generally includes depositing a barrier layer via PVD or CVD over the surface of a substrate having various features formed thereon, depositing a metal (preferably copper) seed layer over the barrier layer, and then electroplating a metal layer (preferably copper) over the seed layer to fill the structure/feature. Finally, the deposited layers are planarized by a method such as chemical mechanical polishing (CMP), for example, to define a conductive interconnect feature.

ECP with copper presents some challenges in substrate manufacturing processes. For instance, ECP copper does not typically plate evenly across the substrate surface, leaving voids and discontinuities in the features. This unevenness is detrimental to circuit uniformity, conductivity, and reliability. Furthermore, ECP copper layers are susceptible to gradual oxidation from atmospheric conditions. This gradual oxidation results in increased electrical resistance of the copper layer. Additionally, since oxidation is typically a slow, gradual, and often variable process, copper layers from different sources plated at different times are likely to have undergone different levels of oxidation. This causes significant variability in subsequent processing of the copper layers.

To overcome problems associated with void formation as well as variation in copper oxidation, heat treatment of a film after deposition is generally performed. One effective technique for heat treating the film is annealing. Annealing is the process of subjecting a material to heat for a specific period of time, and then cooling the material. Annealing can be used to flow a plated metal layer to fill voids, purify layers, dope or encourage diffusion of layers, and manage crystal growth and orientation. More particularly, heat introduced during annealing allows the metal layer to flow and fill in voids in high aspect ratio features. Annealing also provides a thermodynamic driving force for the metal layers to form a predictable microstructure. A metal layer can, for example, be annealed in a particular atmosphere in order to provide a specific and predictable set of electrical properties (e.g. electrical resistivity).

Since copper has a relatively low melting temperature compared to other metals typically deposited in semiconductor manufacturing, copper is a promising candidate for annealing. New developments in semiconductor manufacturing that have focused on depositing copper, especially by ECP techniques, have sparked new interest in developing improved copper annealing processes. Additionally, copper deposited by ECP undergoes the physical phenomena of self-annealing. In self-annealing, copper undergoes microstructural changes after plating at room temperature. High temperature annealing can modify this self-annealing process that would otherwise take place in order to provide a consistent microstructure, as well as consistent electrical properties of the copper.

Current industry practice is to anneal copper layers while subjecting the layers to a high flow rate of nitrogen and hydrogen. Such high flow rates are typically necessary in order to prevent oxygen that is present in the chamber from oxidizing the copper during the anneal and thereby provide the low electrical resistivity required for semiconductor device applications. In a conventional annealing furnace, substrates are heated to about 250° C. to 400° C. for about 30 minutes, and then cooled to room temperature. Unfortunately, the high gas flow rates of conventional furnaces result in high degree of consumption of process gases per unit of copper layer that is processed. As a result, large quantities of process gas are required for processing, resulting in a high processing costs as well as wasted time associated with the continuous replacement of process gas storage containers. Therefore, there is a need to develop an annealing process that is effective at controlling the deleterious effects of atmospheric gases, yet consume reduced quantities of process gas during the annealing process.

SUMMARY OF THE INVENTION

Embodiments of the present invention generally provide a method of annealing a metal layer on a substrate in a chamber. In one embodiment, the method includes positioning a substrate having a metal layer thereon in a chamber, removing atmospheric gases from the chamber, providing process gas to the chamber, and annealing the metal layer at a temperature greater than about 80 degrees Celsius.

Embodiments of the present invention also provide a method of forming a feature on a substrate. In one embodiment, the method comprises depositing a dielectric layer on the substrate, forming at least one opening within the dielectric layer, depositing a metal layer in the opening, positioning the substrate in an annealing chamber, removing atmospheric gases from the annealing chamber, providing process gas to the annealing chamber, and annealing the metal layer at a temperature greater than about 80 degrees Celsius.

BRIEF DESCRIPTION OF THE DRAWINGS

So that the manner in which the above-recited features of the present invention are attained can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
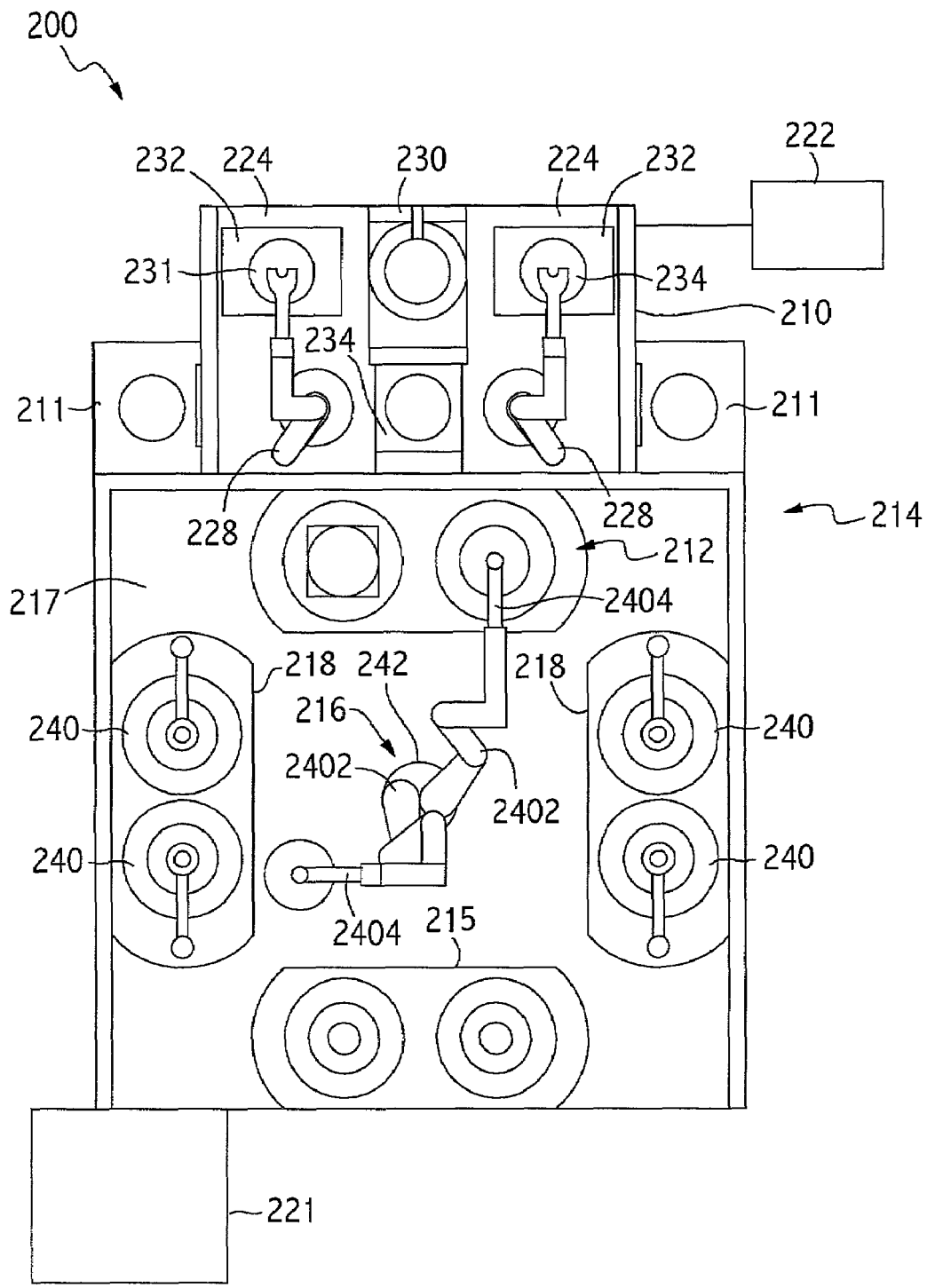
FIG. 1 illustrates an exemplary electroplating system platform of the invention.

FIG. 1 is a schematic view of an ECP system platform 200 incorporating an annealing chamber 211 suitable for performing embodiments of the invention described herein. Suitable systems generally provide both electroplating deposition chambers, typically copper, and annealing chambers in an integrated process. Embodiments are described herein in reference to copper depostion and annealing.

The ECP system platform 200 generally comprises a loading station 210, thermal annealing chamber 211, a mainframe 214, and an electrolyte replenishing system (not shown). The mainframe 214 generally comprises a mainframe transfer station 216, a spin-rinse dry (SRD) station 212, a plurality of processing stations 218, and a seed layer repair station 215.

Preferably, the ECP system platform 200, particularly the mainframe 214, is enclosed in a clean environment using panels such as plexiglass panels. The mainframe 214 includes a base 217 having a plurality of cut-outs formed thereon wherein the cut-outs are configured to receive various stations therein needed to complete the ECPI deposition process. The base 217 is preferably made of aluminum, stainless steel or other rigid materials that can support the various stations disposed thereon. A chemical protection coating, such as Halar™, ethylene-chloro-tri-fluoro-ethaylene (ECTFE), or other protective coatings, is preferably disposed over the surfaces of the base 217 that are exposed to potential chemical corrosion. Preferably, the protective coating provides good conformal coverage over the metal base 217, adheres well to the metal base 217, provides good ductility, and resists cracking under normal operating conditions of the system.

Each processing station 218 may include one or more processing cells 240. An electrolyte replenishing system is generally positioned adjacent the mainframe 214 and connected to the process cells 240 individually to circulate electrolyte used for the ECP process. The ECP system platform 200 also includes a power supply station 221 for providing electrical power to the system and a control system 222, typically comprising a programmable microprocessor.

The mainframe transfer station 216 includes a mainframe transfer robot 242 disposed centrally to provide substrate transfer between various stations on the mainframe. Preferably, the mainframe transfer robot 242 comprises a plurality of individual robot arms 2402 that provide independent access to substrates in the processing stations 218 the SRD stations 212, the seed layer repair stations 215, and other processing stations disposed on or in connection with the mainframe.

As shown in FIG. 1, the mainframe transfer robot 242 includes two robot arms 2402, corresponding to the number of processing cells 240 per processing station 218. Each robot arm 2402 includes an end effector 2404 for holding a wafer during a wafer transfer. Preferably, each robot arm 2402 is operable independently of the other arm to facilitate independent transfers of wafers in the system. Alternatively, the robot arms 2402 operate in a linked fashion such that one robot extends as the other robot arm retracts. The mainframe transfer robot 242 includes a plurality of robot arms 2402 (two shown), and a flipper robot is attached as an end effector 2404 for each of the robot arms 2402. Flipper robots are generally known in the art and can be attached as end effectors for wafer handling robots, such as model RR701, available from Rorze Automation, Inc., located in Milpitas, Calif. The main transfer robot 242 having a flipper robot as the end effector is capable of transferring substrates between different stations attached to the mainframe as well as flipping the substrates being transferred to the desired surface orientation.

The loading station 210 preferably includes one or more substrate cassette receiving areas 224, one or more loading station transfer robots 228 and at least one substrate orientor 230. The number of substrate cassette receiving areas, loading station transfer robots 228 and substrate orientor included in the loading station 210 can be configured according to the desired throughput of the system. As shown in FIG. 1, the loading station 210 includes two substrate cassette receiving areas 224, two loading station transfer robots 228 and one substrate orientor 230. A substrate cassette 232 containing substrates 234 is loaded onto the substrate cassette receiving area 224 to introduce substrates 234 into the electroplating system platform. The loading station transfer robot 228 transfers substrates 234 between the substrate cassette 232 and the substrate orientor 230. The loading station transfer robot 228 comprises a typical transfer robot commonly known in the art. The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the thermal annealing chamber 211. The loading station 210 preferably also includes a substrate cassette 231 for temporary storage of substrates as needed to facilitate efficient transfer of substrates through the system.

Figure 2:
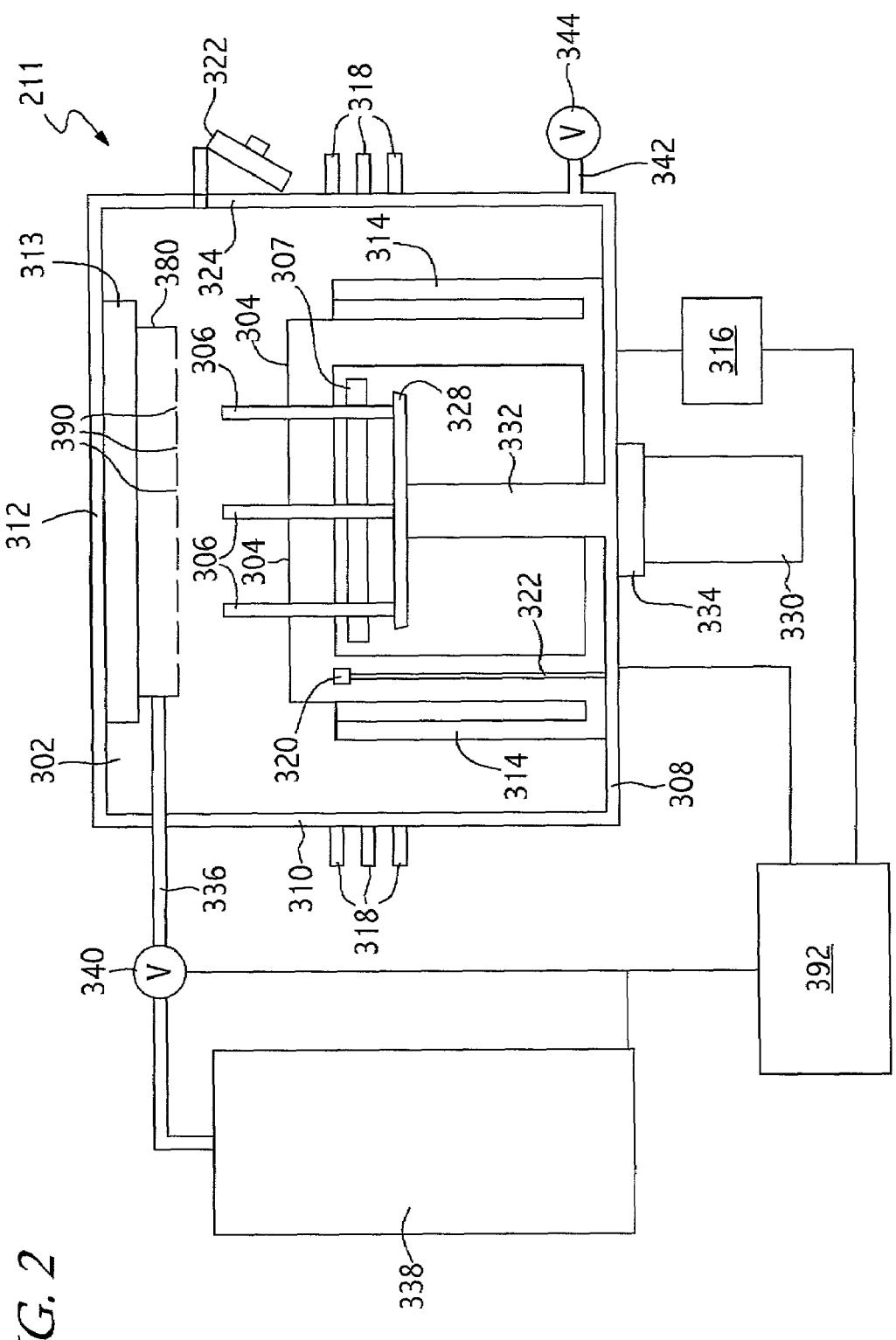
FIG. 2 illustrates a schematic, cross-sectional view of an exemplary rapid thermal annealing chamber of the invention.

FIG. 2 illustrates a cross-sectional view of a rapid thermal annealing chamber 211 for use according to embodiments of the invention. The rapid thermal anneal (RTA) chamber 211 is preferably connected to the loading station 210, and substrates are transferred into and out of RTA chamber 211 by loading station transfer robot 228. The electroplating system platform 200 preferably includes two RTA chambers 211 disposed on opposing sides of the loading station 210, corresponding to the symmetric design of the loading station 210. However, the RTA chambers 211 could be connected to the mainframe 214, or otherwise positioned in the system or provided as a stand alone anneal system.

Thermal anneal process chambers are generally known in the art, and rapid thermal annealing chambers are typically utilized in substrate processing systems to enhance the properties of the deposited materials. The invention contemplates utilizing a variety of thermal annealing chamber designs, including hot plate designs and heat lamp designs, to enhance the electroplating results. One particular thermal annealing chamber useful for the present invention is the chamber described in FIG. 2. Although the invention is described using a hot plate rapid thermal annealing chamber, the invention contemplates application of other thermal annealing chambers as well.

The RTA chamber 211 generally includes an enclosure 302, a heater plate 304, a heater 307, and a plurality of substrate support pins 306. The enclosure 302 includes a base 308, a sidewall 310 and a top 312. Preferably, a cold plate 313 is disposed below the top 312 of the enclosure. Alternatively, the cold plate 313 is integrally formed as part of top 312. A reflector insulator dish 314 may be disposed inside enclosure 302 on base 308. The reflector insulator dish 314 is typically made from a material such as quartz, alumina, or other material that can withstand high temperatures (i.e., greater than about 500° C.), and act as a thermal insulator between the heater 307 and the enclosure 302. The dish 314 may also be coated with a reflective material, such as gold, to direct heat back to the heater plate 304.

The heater plate 304 generally has a large mass compared to the substrate being processed in the system, and is generally fabricated from a material such as silicon carbide, quartz, or other materials that do not react with ambient gases in the RTA chamber 211 or with the substrate material. The heater 307 typically includes a resistive heating element or a conductive/radiant heat source and is disposed between heater plate 304 and a lift plate 328. The heater 307 is electrically coupled to a power source 316 which supplies the energy needed to heat the heater 307. A thermocouple 320 may be positioned in a conduit 322, disposed through the base 308 and dish 314, and extend into the heater plate 304 for the purpose of monitoring the annealing temperature. The thermocouple 320 may be connected to a controller 392, and therefore supply temperature measurements thereto. Controller 392 may then increase or decrease the heat supplied by the heater 307 according to the temperature measurements and a desired anneal temperature.

The enclosure 302 generally includes a cooling member 318 disposed outside of enclosure 302 in thermal contact with the sidewall 310 to cool the enclosure 302. Alternatively, one or more cooling channels (not shown) may be formed into sidewall 310 to control the temperature of enclosure 302. The cold plate 313 disposed on the inside surface of the top 312 cools a substrate that is positioned in close proximity to the cold plate 313.

The RTA chamber 211 generally includes a slit valve 322 disposed on sidewall 310 of enclosure 302 for facilitating transfer of substrates into and out of RTA chamber 211. The slit valve 322 selectively seals an opening 324 on sidewall 310 of the enclosure that communicates with loading station 210. The loading station transfer robot 228 (see FIG. 1) transfers substrates into and out of RTA chamber through opening 324.

The substrate support pins 306 generally include distally tapered members constructed from quartz, aluminum oxide, silicon carbide, or other high temperature resistant materials. Each substrate support pin 306 is disposed within a tubular conduit 326, typically made of a heat and oxidation resistant material, that extends through the heater plate 304. The substrate support pins 306 are connected to the lift plate 328 for moving the substrate support pins 306 in a uniform manner. The lift plate 328 is attached to an actuator 330, such as a stepper motor, through a lift shaft 332 that moves the lift plate 328 to facilitate positioning of a substrate at various vertical positions within the RTA chamber 211. The lift shaft 332 extends through the base 308 of the enclosure 302 and is sealed by a sealing flange 334 disposed around the shaft.

In order to transfer a substrate into RTA chamber 211, slit valve 322 is opened, and loading station transfer robot 228 extends its robot blade having a substrate positioned thereon through opening 324 into RTA chamber 211. The robot blade of loading station transfer robot 228 positions the substrate in the RTA chamber above heater plate 304, and the substrate support pins 306 are extended upwards to lift the substrate above the robot blade. The robot blade then retracts out of the RTA chamber 211, and the slit valve 322 closes the opening. The substrate support pins 306 are then retracted to lower the substrate to a desired distance from heater plate 304.

A gas inlet 336 coupled to a showerhead 380 with apertures 390 formed therethrough, is disposed through sidewall 310 of enclosure 302 to allow selected gas flow into RTA chamber 211 during the anneal treatment process. The gas inlet 336 is connected to a gas source 338 through a valve 340 for controlling the flow of the gas into RTA chamber 211. A gas outlet 342 is preferably disposed at a lower portion of the sidewall 310 to exhaust the gases in RTA chamber 211, and may be connected to a relief/check valve 344 to prevent backstreaming of atmosphere from outside of the chamber 211. The gas outlet 342 is connected to a vacuum pump (not shown) to exhaust the RTA chamber to a desired vacuum level during an anneal treatment.

Referring again to FIG. 1, the control system 222 controls the functions of each component of the platform. Control system 222 may be mounted above mainframe 214 and include a programmable microprocessor-type controller. The control system may further comprise other components such as, for example, memory and support circuits. The processor may also include means for computing specific properties, neural networks, or other logic techniques for determining an appropriate flow rate for the one or more chemical components. The memory is generally coupled to the microprocessor-type controller and may be a computer-readable medium, such as random access memory (RAM), read only memory (ROM), a floppy disk, hard disk, or any other form of digital storage, local or remote. The support circuits are coupled to the microprocessor-type controller for supporting the controller in a conventional manner. These circuits include cache, power supplies, clock circuits, input/output circuitry, subsystems, and the like.

The programmable controller 222 is typically programmed using a software designed specifically for controlling all components of the electroplating system platform 200. The control system 222 also provides electrical power to the components of the system and includes a control panel (not shown) that allows an operator to monitor and operate the electroplating system platform 200. The control panel is a stand-alone module that is connected to the control system 222 through a cable and provides easy access to an operator. Generally, the control system 222 coordinates the operations of the loading station 210, the RTA chamber 211, the SRD station 212, the mainframe 214 and the processing stations 218. Additionally, the control system 222 coordinates with the replenishing system to provide the electrolyte for the electroplating process. The control system 222 also coordinates with controller 392.

Annealing Process

According to an embodiment of the invention, a substrate with a metal layer thereon is annealed in a chamber, such as an RTA chamber 211. The metal layer may have been formed by an ECP process in an ECP cell, such as processing cell 240.

Figure 3:
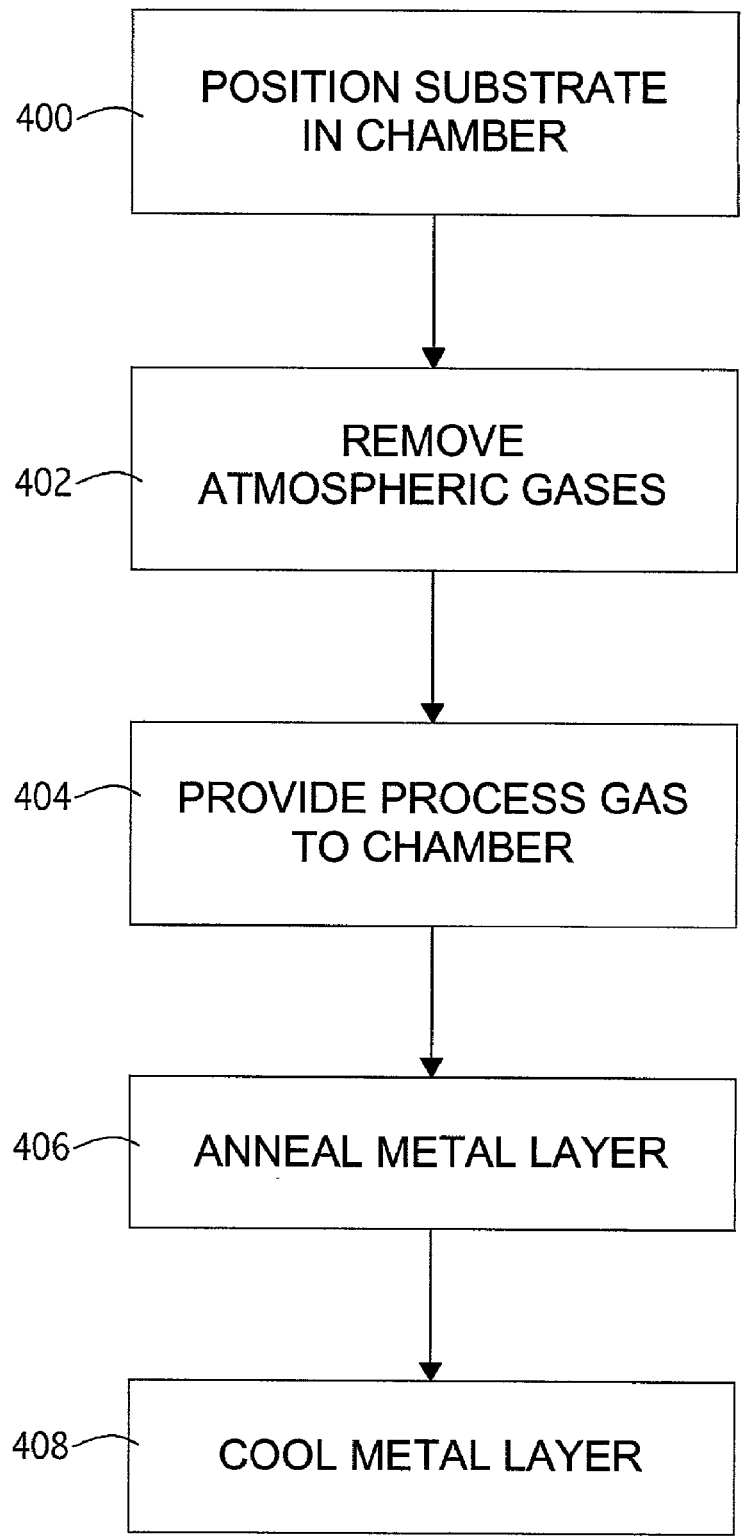
FIG. 3 illustrates an exemplary process flow diagram of a method of annealing a metal layer of the invention.

FIG. 3 illustrates a process flow diagram that illustrates a process of annealing a substrate with a metal layer formed thereon. As shown in step 400, a substrate with a metal layer formed thereon is positioned within a chamber, such as, for example, RTA chamber 211. Then, as shown in step 402, atmospheric gases are removed from the chamber using, for example, a vacuum pump. Atmospheric gases are those gases that are present in the ambient atmosphere at the time the annealing process is conducted. Atmospheric gases typically comprise oxygen, nitrogen, among other gases. In one embodiment, the chamber 211 is pumped to a pressure less than about 5 torr. In another embodiment, the chamber 211 is pumped down to a pressure less than about 1 torr. In order to provide rapid throughput of the anneal process, atmospheric gases are preferably pumped out of chamber 211 at a reasonably high rate. In one embodiment, the pressure of the chamber 211 is brought to less than about 5 torr in a period of time ranging from about 3 seconds to about 5 seconds. Process gas is then provided to chamber 211, as indicated in step 404. The process gas may be supplied to chamber 211 through showerhead 380. Preferably, the process gas includes an inert gas selected from the group consisting of nitrogen ($N_2$), argon (Ar), helium (He), and combinations thereof. The process gas may further include hydrogen. The concentration of hydrogen in the process gas may be between about 2.5% and about 4.5%. The process gas flow into RTA chamber 211 may be maintained in a range of about 2 standard liters per minute (slm) to about 6 slm. In one embodiment, the flow rate of the process gas is maintained throughout the annealing step (described below) in a range from about 4 slm to about 6 slm for a chamber 211 with a volume of about 10 liters. Generally, the desirable flow rate of process gas is about 0.4 slm to about 0.6 slm of gas per liter of chamber 211. The chamber pressure rises as process gas flows into the chamber 211.

As shown in step 406, the metal layer is subject to an annealing step at a temperature greater than about 80° C. The metal layer is preferably annealed at a temperature in the range from about 80° C. to about 400° C. for a period of time of about 15 seconds to about 180 seconds. In a preferred embodiment, the substrate is annealed at a temperature of about 250° C. for about 30 seconds. It is further preferred that the chamber pressure rises to a pressure that enables a high rate of cooling in the subsequent cooling step, discussed below. The chamber pressure is preferably in the range of about 100 torr to about 150 torr by the time the anneal step is completed.

Rapid thermal anneal processing typically requires a temperature increase of at least about 50 Celsius degrees per second. To provide the required rate of temperature increase for the substrate during the anneal treatment, the heater plate 304 is preferably maintained at between about 80° C. and about 400° C., and the substrate is preferably positioned in contact with the heater plate 304 for the duration of the anneal treatment process. The control system 222 controls the operation of the RTA chamber 211, including maintaining the desired ambient environment in the RTA chamber and the temperature of the heater plate.

After the annealling step is completed, the metal layer is subject to a cooling step, as shown at step 408. At the start of the cooling step, the chamber pressure is preferably in a range that enables a high rate of cooling. If the chamber pressure is too high once cooling begins, heat transfer is likely to be impeded by the reduced mean free path between molecules of process gas. If the pressure is too low, heat transfer will also likley be sub-optimal. The pressure is preferably in a range of about 100 to about 150 torr when the cooling step is initiated and throughout the duration of the cooling step. Initially, the substrate is brought into the proximity of cold plate 313 to facilitate the cooling of the substrate and metal layer thereon. The lift shaft 332 moves the lift plate 328 to facilitate positioning of the substrate in the proximity of the cold plate 313 via closing of the gap between the substrate and the cold plate 313 by lifting the substrate toward the cold plate 313. In one embodiment, the cooling of the substrate and metal layer formed thereon takes place rapidly. The temperature of the substrate and metal layer formed thereon is reduced from a temperature in the range of about 80 Celsius to about 400 Celsius to a temperature in the range of about 50 Celsius to about 100 Celsius in a period of less than about 30 seconds. In one embodiment, the temperature of the substrate and metal layer formed thereon is reduced from a temperature in the range of about 80 Celsius to about 400 Celsius to a temperature in the range of about 60 Celsius to about 80 Celsius in a period of less than about 30 seconds. Process gas may continue to be provided to the chamber 211 during the cooling step. The flow rate of process gas is preferably in the range of about 4 slm to about 6 slm.

Substrate support pins 306 then lift the substrate to a position for transfer out of the RTA chamber 211. The slit valve 322 opens, and the robot blade of the loading station transfer robot 228 is extended into the RTA chamber and positioned below the substrate. The substrate support pins 306 retract to lower the substrate onto the robot blade, and the robot blade then retracts out of the RTA chamber. The loading station transfer robot 228 then transfers the processed substrate into the cassette 232 for removal out of the electroplating processing system.

The annealing process described herein significantly reduces consumption of process gas. Since atmospheric gases are removed from the chamber before introducing process gas, the flow rate of process gas required is greatly reduced when compared to the prior art. Furthermore, the metal layer, when subject to an anneal process having the time, chamber pressure, and temperature profile as described, results in a microstructure that is highly consistent from batch to batch in terms of electrical resistivity.

Integrated Circuit Fabrication Process

FIG. 4 illustrates a cross-sectional diagram of a layered structure 10 showing a dielectric layer 14 formed on a substrate layer 12. In general, substrate 12 refers to any workpiece upon which film processing is performed. Depending upon the specific stage of processing, the substrate 12 may correspond to a silicon wafer, or other material layers, which have been formed on the substrate. FIG. 4a, illustrates, for example, dielectric layer 14 formed over the underlying substrate layer 12 in accordance with procedures known in the art to form a part of the overall integrated circuit. Dielectric layer 14 may comprise, for example, an oxide, such as silicon dioxide. Once the dielectric layer 14 is deposited, the dielectric layer 14 is, for example, etched to form at least one opening 16 within dielectric layer 14. The opening 16 has a floor 20 exposing a small portion of the underlying substrate layer 12 and dielectric sidewalls 22.

Etching of the dielectric layer 14 may be accomplished with any dielectric etching process, including plasma etching. Specific chemical etchants used to etch dielectrics such as silicon dioxide or organic dielectric materials may include such chemical etchants as buffered hydrofluoric acid or acetone. However, patterning and etching may be accomplished using any method known in the art. The substrate 12 may be a layer, wire or device comprising a metal, doped silicon or other conductive material.

Figure 4A:
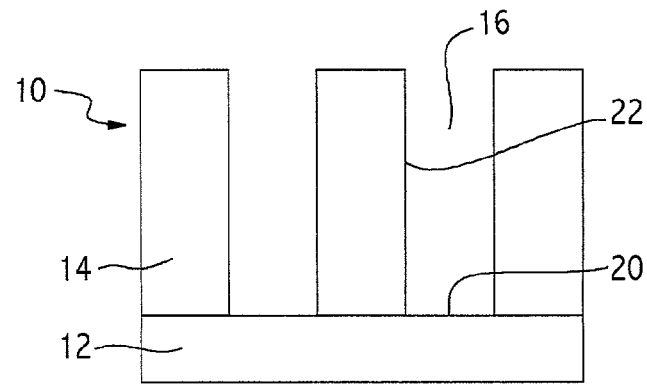
FIGS. 4a–4d illustrate cross-sectional views of an exemplary method of forming a feature on a substrate in accordance with an embodiment of the invention.
Figure 4B:
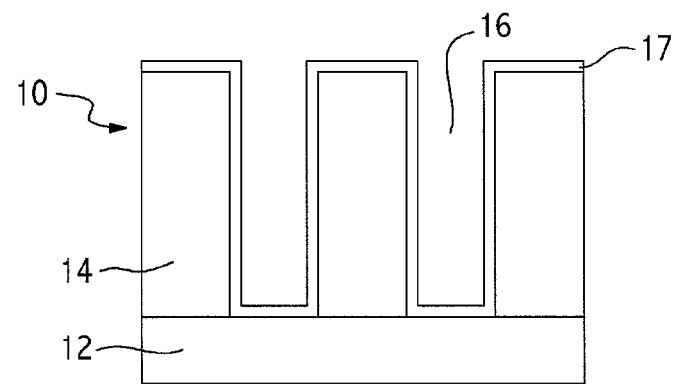

As shown in FIG. 4b, an optional barrier layer 17 is conformally formed atop layer 14. The barrier layer 17 is deposited to prevent or restrict diffusion between a subsequently deposited metal layer, the substrate 12, and dielectric layer 14. For a metal layer that comprises copper, a preferred barrier layer 17 may comprise such materials as refractory metals (such as tungsten (W), tungsten nitride (WN), niobium (Nb), aluminum silicates, etc.), tantalum (Ta), tantalum nitride (TaN), titanium nitride (TiN), PVD Ti/N$_2$-stuffed, doped silicon, aluminum, and aluminum oxides, a ternary compound (such as TiSiN, WSiN, etc.) or a combination of these layers. The most preferred barrier materials are Ta and TaN, which typically are deposited by physical vapor deposition (PVD).

Figure 4C:
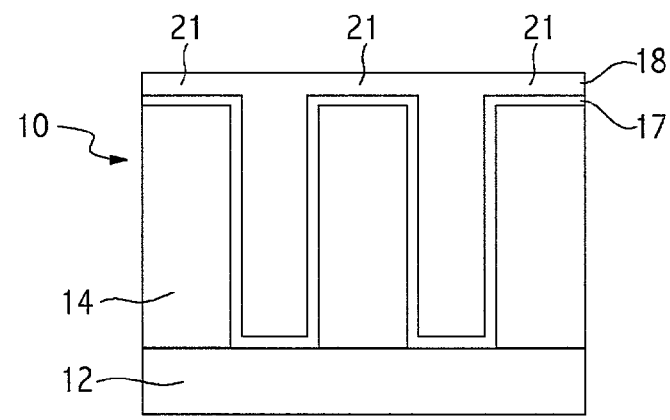

As shown in FIG. 4c, a metal layer 18 is formed atop the optional barrier layer 17. In a preferred embodiment, the metal layer 18 completely fills the opening 16. In order to fill the opening 16, it will generally require that an entire field 21 of the structure will be covered with the metal. In one embodiment, the metal layer 18 is formed of copper. The metal layer 18 may be deposited by any known method in the art, such as, for example, physical vapor deposition (PVD), chemical vapor deposition (CVD), or ECP. Alternatively, a thin seed layer (not shown) may be deposited prior to depositing metal layer 18 to help deposition of the ECP copper layer 18. The seed layer may be, for example, copper deposited by physical vapor deposition (PVD) or chemical vapor deposition (CVD); however, any suitable copper seed layer contemplated in the art may be used.

The annealing process is then performed as described above by positioning the substrate 12 in an annealing chamber, such as, for example, RTA chamber 211. The substrate 12 with metal layer 18 thereon is positioned within a chamber, such as, for example, RTA chamber 211. Atmospheric gases are then removed from the chamber. Process gas is then provided to the chamber 211. The metal layer 18 is subject to an annealing step at a temperature greater than about 80° C. The metal layer 18 is preferably annealed at a temperature in the range from about 80° C. to about 400° C. for a period of time of about 15 seconds to about 180 seconds. After the annealling step is completed, the metal layer is subject to a cooling step in which the substrate is preferably brought into the proximity of the cold plate 313 in order to facilitate the cooling of the substrate and metal layer thereon. The cooling step is maintained for a duration of time in the range of about 30 seconds.

Figure 4D:
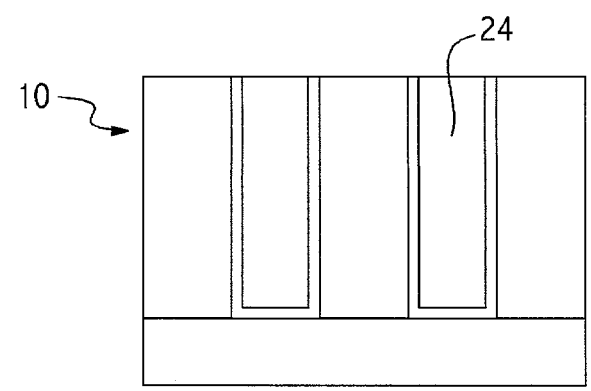

The feature may be further processed, as indicated in FIG. 4d, by planarizing the top portion of metal layer 18, preferably by chemical mechanical polishing (CMP). During the planarization process, portions of the copper layer 18 are removed from the top of the structure leaving a fully planar (flat) surface with a conductive feature 24 formed in the via 16 therein.

Annealing the copper layer will cause the copper to flow and fill any voids (not shown) formed in the openings 16 and further manage grain growth and crystal orientation of the copper layer 18. The method of annealing is particualrly beneficial in that it enables significantly reduced consumption of process gas. Since atmospheric gases are removed from the chamber before introducing process gas, the flow rate of process gas required is greatly reduced versus the prior art. Furthermore, the annealing and cooling steps, when conducted under the conditions thus specified, provide a metal layer with a highly consistent and predicatable microstructure as well as consistent electrical resistivity. The method further provides a metal layer with more consistent behavior with respect to planarization and other process steps subsequent to annealing.

While the foregoing is directed to embodiments of the present invention, other and further embodiments of the invention may be devised without departing from the basic scope thereof, and the scope thereof is determined by the claims that follow.

What is claimed is:

1. A method of annealing a metal layer on a substrate in a chamber, comprising:
   positioning the substrate having the metal layer thereon in the chamber;
   removing atmospheric gases from the chamber;
   providing process gas to the chamber;
   annealing the metal layer at a temperature greater than about 80 degrees Celsius; and
   cooling said metal layer while maintaining a chamber pressure of about 100 Torr to about 150 Torr throughout said cooling.

2. The method of claim 1, wherein the annealing the metal layer is performed at a temperature within a range of about 80 degrees Celsius to about 400 degrees Celsius.

3. The method of claim 1, wherein removing atmospheric gases comprises pumping the chamber to a pressure less than about 5 Torr.

4. The method of claim 3, wherein the pumping has a duration in the range of about 3 seconds to about 5 seconds.

5. The method of claim 1, wherein providing the process gas comprises providing one or more gases selected from the group consisting of nitrogen, hydrogen, argon, helium, and combinations thereof.

6. The method of claim 1, wherein the process gas has a concentration of hydrogen in the range of about 2.5% to about 4.5%.

7. The method of claim 1, wherein the process gas is provided to the chamber at a flow rate in the range of about 0.2 slm to about 0.6 slm per liter of chamber volume.

8. The method of claim 1, wherein said annealing has a duration in the range of about 15 seconds to about 180 seconds.

9. The method of claim 1, wherein the process gas is provided to the chamber during at least a portion of the annealing.

10. The method of claim 1, wherein the metal layer comprises copper.

11. The method of claim 1, wherein cooling the metal layer comprises achieving a temperature in the range of about 50 degrees Celsius to about 100 degrees Celsius within a period of about 30 seconds.

12. The method of claim 11, wherein the pressure of the process gas in the chamber during the annealing is in the range of about 100 Torr to about 150 Torr.

13. The method of claim 11, wherein the cooling the metal layer comprises bringing the substrate into the proximity of a cold plate.

14. The method of claim 1, wherein the metal layer is deposited by electroplating.

15. A method of annealing a copper layer in a chamber, comprising:
   (a) positioning a substrate having the copper layer thereon in the chamber;
   (b) pumping the chamber to a pressure less than about 5 Torr;

(c) providing process gas to the chamber at a flow rate less than about 0.6 slm per liter of chamber;

(d) annealing the copper layer at a temperature greater than about 80 degrees Celsius for a duration of about 15 seconds to about 180 seconds; and (e) reducing the temperature of the copper layer to a temperature in the range of about 50 degrees Celsius to about 100 degrees Celsius within a period of about 30 seconds.

16. The method of claim 15, wherein the process gas is selected from the group consisting of nitrogen, hydrogen, argon, helium, and combinations thereof.

17. The method of claim 15, wherein the process gas in (c) is provided to the chamber at a flow rate in the range of about 0.4 slm per liter of chamber to about 0.6 slm per liter of chamber.

18. The method of claim 15, wherein the annealing of (d) is performed at a temperature in the range of about 80 degrees Celsius to about 400 degrees Celsius for a duration in the range of about 15 seconds to about 180 seconds.

19. The method of claim 15, wherein the temperature of the copper layer in (e) is reduced to a temperature of about 60 degrees Celsius to about 80 degrees Celsius within a period of about 30 seconds.

20. A method of forming a feature on a substrate, comprising:

(a) depositing a dielectric layer on the substrate;

(b) forming at least one feature in the dielectric layer;

(c) depositing a metal layer in the at least one feature;

(d) positioning the substrate in an annealing chamber;

(e) removing atmospheric gases from the annealing chamber;

(f) providing process gas to the annealing chamber;

(g) annealing the metal layer at a temperature greater than about 80 degrees Celsius; and (h) cooling said metal layer while maintaining a pressure of about 100 Torr to about 150 Torr throughout said cooling.

21. The method of claim 20, wherein (g) is performed at a temperature between about 80 degrees Celsius and about 400 degrees Celsius.

22. The method of claim 20, wherein (e) comprises pumping the chamber to a pressure less than about 5 torr.

23. The method of claim 22, wherein the pumping of (e) has a duration of about 3 seconds to about 5 seconds.

24. The method of claim 20, wherein the process gas of (f) comprises one or more gases selected from the group consisting of nitrogen, hydrogen, argon, helium, and combinations thereof.

25. The method of claim 20, wherein the process gas has a concentration of hydrogen in the range of about 2.5% to about 4.5%.

26. The method of claim 20, wherein the process gas is provided to the chamber at a flow rate of about 2 slm to about 6 slm.

27. The method of claim 20, wherein (g) has a duration of about 15 seconds to about 180 seconds.

28. The method of claim 20, wherein the process gas of (f) is provided to the chamber during at least a portion of (g).

29. The method of claim 20, wherein the metal layer comprises copper.

30. The method of claim 20, wherein:

the metal layer is cooled to a temperature in the range of about 50 degrees Celsius to about 100 degrees Celsius within a period of about 30 seconds.

31. The method of claim 30, wherein (h) comprises bringing the substrate into the proximity of a cold plate.

32. The method of claim 20, wherein the metal layer is deposited by electroplating.

33. The method of claim 20, further comprising (i) planarizing the metal layer.

34. A method of forming a feature on a substrate, comprising:

(a) depositing a dielectric layer on the substrate;

(b) forming at least one feature in the dielectric layer;

(c) depositing a copper layer in the at least one feature;

(d) positioning the substrate in an annealing chamber;

(e) pumping the annealing chamber to a pressure less than about 5 torr;

(f) providing process gas to the annealing chamber at a flow less than about 0.6 slm per volumetric liter of the annealing chamber;

(g) annealing the copper layer at a temperature greater than about 80 degrees Celsius for a duration of about 15 seconds to about 180 seconds; and (h) reducing the temperature of the copper layer to a temperature of about 50 degrees Celsius to about 100 degrees Celsius within a period of about 30 seconds.

35. The method of claim 34, wherein the process gas is selected from the group consisting of nitrogen, hydrogen, argon, helium, and combinations thereof.

36. The method of claim 34, wherein the process gas in (f) is provided to the chamber at a flow rate in the range of about 0.4 slm per liter of chamber to about 0.6 slm per liter of chamber.

37. The method of claim 34, wherein the annealing of (g) is performed at a temperature of about 80 degrees Celsius to about 400 degrees Celsius for a duration of about 15 seconds to about 180 seconds.

38. The method of claim 34, wherein the temperature of the copper layer is reduced to a temperature in the range of about 60 degrees Celsius to about 80 degrees Celsius within a period of about 30 seconds.

39. A computer storage medium containing a software routine that, when executed, causes a general purpose computer to control a deposition chamber using a layer deposition method, comprising:

(a) positioning a substrate having a metal layer thereon in the chamber;

(b) removing atmospheric gases from the chamber;

(c) providing process gas to the chamber;

(d) annealing the metal layer at a temperature greater than about 80 degrees Celsius; and (e) cooling said metal layer while maintaining a chamber pressure of about 100 Torr to about 150 Torr throughout said cooling.

40. The computer storage medium of claim 39, wherein the annealing of step (d) is performed at a temperature within a range of about 80 degrees Celsius to about 400 degrees Celsius.

41. The computer storage medium of claim 39, wherein (b) comprises pumping the chamber to pressure less than about 5 Torr.

42. The computer storage medium of claim 41, wherein the pumping of (b) has a duration in the range of about 3 seconds to about 5 seconds.

43. The computer storage medium of claim 39, wherein the process gas of (c) comprises one or more gases selected from the group consisting of nitrogen, hydrogen, argon, helium, and combinations thereof.

44. The computer storage medium of claim 39, wherein the process gas has a concentration of hydrogen in the range of about 2.5% to about 4.5%.

45. The computer storage medium of claim 39, wherein the process gas is provided to the chamber at a flow rate in the range of about 2 slm to about 6 slm.

46. The computer storage medium of claim 39, wherein (d) has a duration in the range of about 15 seconds to about 180 seconds.

47. The computer storage medium of claim 39, wherein the process gas of (c) is provided to the chamber during at least a portion of step (d).

48. The computer storage medium of claim 39, wherein the metal layer comprises copper.

49. The computer storage medium of claim 39, wherein the layer deposition method cools the metal layer to a temperature in the range of about 50 degrees Celsius to about 100 degrees Celsius for a duration of 30 seconds.

50. The computer storage medium of claim 49, wherein (e) comprises bringing the substrate into the proximity of a cold plate.

51. The computer storage medium of claim 39, wherein the metal layer is deposited by electroplating.

52. A computer storage medium containing a software routine that, when executed, causes a general purpose computer to control a deposition chamber using a layer deposition method, comprising:
 (a) positioning a substrate having a copper layer thereon in the chamber;
 (b) pumping the chamber to a pressure less than about 5 Torr;
 (c) providing process gas to the chamber at a flow rate less than about 0.6 slm per liter of chamber;
 (d) annealing the copper layer at a temperature greater than about 80 degrees Celsius for a duration in the range of about 15 seconds to about 180 seconds; and
 (e) reducing the temperature of the copper layer to a temperature in the range of about 50 degrees Celsius to about 100 degrees Celsius within a period of about 30 seconds.

53. The computer storage medium of claim 52, wherein the process gas is selected from the group consisting of nitrogen, hydrogen, argon, helium, and combinations thereof.

54. The computer storage medium of claim 52, wherein the process gas in (c) is provided to the chamber at a flow rate in the range of about 0.4 slm per liter of chamber to about 0.6 slm per liter of chamber.

55. The computer storage medium of claim 52, wherein the annealing of (d) is performed at a temperature in the range of about 80 degrees Celsius to about 400 degrees Celsius for a duration in the range of about 15 seconds to about 180 seconds.

56. The computer storage medium of claim 52 wherein the temperature of the copper layer is reduced to a temperature in the range of about 60 degrees Celsius to about 80 degrees Celsius within a period of about 30 seconds.

57. A method for annealing a copper layer deposited at least partially via an electrochemical plating process, comprising:
 substantially removing atmospheric gases from an annealing chamber having a substrate positioned therein, the substrate having the copper layer deposited thereon;
 flowing a non-oxidizing process gas to the annealing chamber at a flow rate of less than about 0.6 slm;
 annealing the substrate at a temperature greater than about 80 degrees Celsius for more than about 15 seconds and less than about 3 minutes; and
 cooling said substrate while maintaining a chamber pressure of about 100 Torr to about 150 Torr throughout said cooling.

58. The method of claim 57, wherein the substrate is cooled to a temperature range of between about 60 degrees Celsius and about 80 degrees Celsius within a period of about 30 seconds.

59. The method of claim 57, wherein the non-oxidizing process gas is supplied to the annealing chamber and provides a pressure in the range of about 100 Torr to about 150 Torr.

60. The method of claim 57, wherein substantially removing atmospheric gases comprises pumping the annealing chamber to about 5 Torr.

61. The method of claim 15, further comprising maintaining a chamber pressure of about 100 Torr to about 150 Torr throughout (e).

62. The method of claim 34, further comprising maintaining a chamber pressure of about 100 Torr to about 150 Torr throughout step (h).

63. The computer storage medium of claim 52, further comprising maintaining a chamber pressure of about 100 Torr to about 150 Torr throughout (e).

* * * * *

UNITED STATES PATENT AND TRADEMARK OFFICE
CERTIFICATE OF CORRECTION

| | |
|---|---|
| PATENT NO. | : 7,109,111 B2 |
| APPLICATION NO. | : 10/074353 |
| DATED | : September 19, 2006 |
| INVENTOR(S) | : Wang et al. |

It is certified that error appears in the above-identified patent and that said Letters Patent is hereby corrected as shown below:

Column 8, Line 3: Change "liklely" to --likely--

Column 12, Claim 40, Line 52: Delete "step"

Column 14, Claim 56, Line 6: Insert a comma after "52"

Column 14, Claim 62, Line 40: Delete "step"

Signed and Sealed this

Twentieth Day of March, 2007

JON W. DUDAS
*Director of the United States Patent and Trademark Office*